United States Patent [19]

Goetzberger

[11] 4,330,680

[45] May 18, 1982

[54] INTEGRATED SERIES-CONNECTED SOLAR CELL

[75] Inventor: Adolf Goetzberger, Merzhausen, Fed. Rep. of Germany

[73] Assignee: Fraunhofer Gesellschaft zur Forderung der angewandten Forschung e.v., Munich, Fed. Rep. of Germany

[21] Appl. No.: 201,644

[22] Filed: Oct. 28, 1980

[51] Int. Cl.³ .......................................... H01L 31/06
[52] U.S. Cl. .................................. 136/247; 136/249; 357/30
[58] Field of Search ................... 136/247, 249; 357/30

[56] References Cited

U.S. PATENT DOCUMENTS 3,104,188  9/1963  Moncrieff-Yeates ............... 136/249
4,281,208  7/1981  Kuwano et al. ..................... 136/249

OTHER PUBLICATIONS

J. C. Evans, Jr. et al., "The Planar Multijunction Cell-A New Solar Cell for Earth & Space", Proc. 15th Intersociety Energy Conversion Conf., Seattle, WA Aug. 18-22, 1980, pp. 358-363.

Primary Examiner—Aaron Weisstuch
Attorney, Agent, or Firm—John C. Smith, Jr.

[57] ABSTRACT

A row of strip-shaped semiconductor junctions is arranged on each of the two surfaces of a semiconductor substrate possessing a high ohmic resistance, these junctions having $p^+$- and $n^+$-conduction characteristics in alternation and being parallel to each other and spaced at intervals, in such a way that a semiconductor junction having a $p^+$-conduction characteristic on one surface of the semiconductor substrate is, in each case, located opposite a semiconductor junction having an $n^+$-conduction characteristic on the other surface, and printed circuit tracks are arranged, in alternation, on one surface and on the other surface of the semiconductor substrate, these tracks connecting, in each case, one series of solar cell junctions with a neighboring series, in series-connection.

15 Claims, 8 Drawing Figures

INTEGRATED SERIES-CONNECTED SOLAR CELL

BACKGROUND OF THE INVENTION

Solar cells are known to provide a voltage which is limited by the energy gap of the semiconductor employed, this voltage being, as a rule, approximately 50 to 80% of the energy gap. For example, silicon solar cells, having a Si energy gap of 1.1 eV, provide a voltage of approximately 0.6 V under open circuit conditions. In practice, this low voltage of the solar cells is extremely inconvenient, since a higher voltage is demanded for every possible application, which means that a row of solar cells must always be connected in series. The tedious interconnection of each individual cells gives rise to an appreciable proportion of the cost of the complete system.

The present invention provides a solar cell structure which enables many cells to be connected in series on one substrate, in an integrated form. Using this structure, it is possible to satisfy the requirements of many applications with only one solar cell and, in the case of large systems, to decrease the effort involved in interconnection by a significant amount.

STATE OF THE ART

Some proposals are already known, with regard to how series-connection of cells can be achieved in a monolithic structure, but none of these proposals have hitherto gained acceptance, due to technical problems. The proposal described in U.S. Pat. No. 3,370,986 is very old, this process essentially amounting to the interconnection of individual cells, using hybrid technology, on a substrate which is provided with printed circuit tracks.

Another proposal relates to a horizontal multi-junction cell and is described in U.S. Pat. No. 3,994,012. This patent specification describes an arrangement in which, in a semiconductor substrate, a number of solar cells having p-n transitions are arranged to form a series of semiconductor junctions, built up normal to the plane of the semiconductor substrate, spaced at intervals and in a row parallel to the plane of the semiconductor substrate, and in which the solar cells are series-connected by printed circuit tracks deposited on the semiconductor substrate in contact with the semiconductor junctions. It is technologically possible to produce this structure in the case of semiconductor materials having a high absorption coefficient for the electromagnetic radiation to be converted, that is to say, for semiconductors having a direct band structure, for which a thin layer of material, of some few µm, is sufficient. Major technological problems arise in the case of indirect semiconductor materials, to which silicon also belongs, which must have a layer thickness of at least 50 µm, or better, more than 100 µm, in order to achieve sufficient absorption of the radiation. To make the cell according to U.S. Pat. No. 3,994,012, a highly-doped zone must therefore be produced at the interconnection points, extending from the surface of the cell down to the lowermost p-layer or n-layer. According to the current state of the art, this structure can be produced only by diffusion of the p-doping or n-doping, diffusion through layer thicknesses of this magnitude being extremely time-consuming. Also, a particular problem results from the fact that the diffusion does not progress only in a direction normal to the plane of the substrate, but that the highly-doped zone also spreads horizontally, in a uniform manner, towards both sides, this effect leading to a considerable space requirement for $n^+$-junctions or $p^+$-junctions. Since this area does not belong to the active solar cell, the conversion efficiency is considerably reduced.

Another solar cell, which is important in this context, is the "interdigitated solar cell" described by M. P. Lammert and R. J. Schwarz, IEEE Trans ED-24, 337 (1977). This cell is based on recognition of the fact that, in semiconductor material having a high ohmic resistance, the density of charge carriers which is produced, under equilibrium conditions, by the irradiation is higher than the density of charge carriers resulting from the doping. By means of $p^+$-junctions and $n^+$-junctions which have been diffused in side by side, the photoelectrically generated charge carriers are separated, so that the photoelectric voltage can be tapped off between these junctions. A precondition for the functioning of the array is that the layer thickness of the semiconductor and the mutual separation of the highly-doped junctions does not exceed the diffusion length of the charge carriers. An array according to this proposal cannot, however, be used directly for series-connection, since it would lead only to short-circuits.

Series-connected solar cells are of particular importance for concentrated systems, in which sunlight is concentrated on a solar cell, by lenses or by other devices. Due to the high current densities which occur in concentrator cells, ohmic resistances play a special part. The influence of these resistances can be reduced by increasing the voltage, by means of series-connection in the cell, at the expense of the current.

In addition to the concentrator systems, which function with the aid of lenses and mirrors, on the basis of geometric optics, another concept has recently been disclosed by A. Goetzberger and W. Greubel in Appl. Phys. 14, 123 (1977). This concept enables diffuse light to be concentrated by means of a fluorescence effect, namely the fluorescence collector. The new structure proposed in the present application is particularly suitable for collectors of this type. A review of solar cells for concentrators is given by H. J. Hovel, IBM, J. Res. Dev. 22, 112 (1978).

SUMMARY OF THE INVENTION

It is an object of the present invention to avoid the disadvantages of the solutions known hitherto.

According to the invention, a solar cell is provided which, in spite of a considerable thickness of the semiconductor material, requires only the introduction of very thin doped junctions and which enables interconnection to be effected by means of printed circuit tracks on the surface, to form the monolithic series-connected cell.

BRIEF DESCRIPTION OF THE DRAWINGS

Several preferred embodiments of the invention will now be described by way of example and with reference to the accompanying drawings in which.

DESCRIPTION OF THE PREFERRED EMBODIMENTS

Figure 1A:
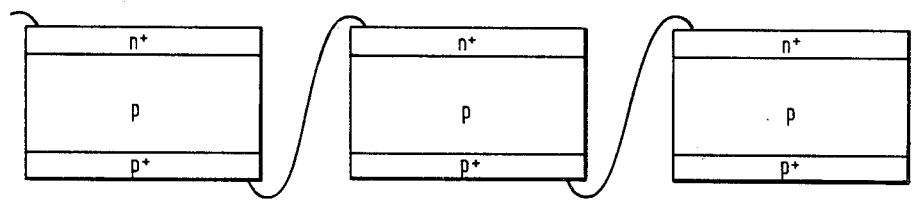
FIG. 1a shows how series-connected solar cells are formed from discrete individual cells, connected one behind the other.
Figure 1B:
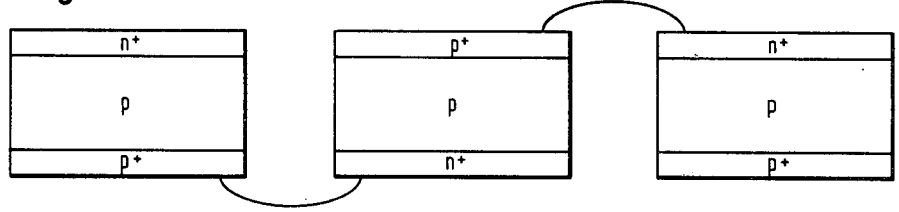
FIG. 1b shows the individual cells rotated in such a way that the interconnection can in each case be effected on one side.
Figure 1C:
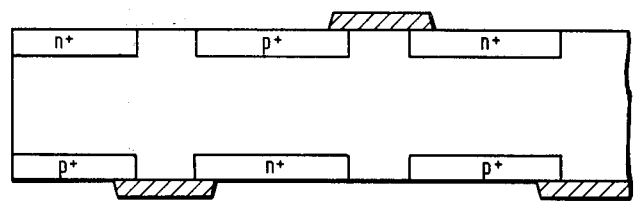
FIG. 1c shows this structure finally completed, in monolithic form, with vapor-deposited printed circuit tracks.

FIGS. 1a, 1b and 1c show how an integrated solar cell is formed by series-connecting individual solar cells. The n+p p+ cells are regarded as having orientations which are alternately reversed, and this array is consolidated into a monolithic structure by means of metal contact paths, which effect the series-connection. These structures then function, provided that the substrate—the zone between p+ and n+—has as high an ohmic resistance as possible, when, in operation, the charge carriers generated by light have a higher concentration than those resulting from the doping. A further precondition is that the thickness of the solar cell is less than the diffusion length of the charge carriers. As can be seen from FIGS. 1a, 1b and 1c, the integrated solar cell also has the advantage that it can be illuminated either from only one side, or from both sides. This feature is particularly advantageous for the application to fluorescence collectors.

The integrated solar cell, as represented in FIGS. 1a, 1b and 1c, has, nevertheless, a disadvantage: twice the voltage, which is generated in an individual cell, is present, in each case, between two p+-junctions and n+-junctions which are not interconnected by metal contact paths, this voltage being present in the flux direction. An injection current thereby flows between the two junctions; this current, as a parasitic current, flowing in opposition to the useful current. Measures must accordingly be taken to separate these junctions electrically. Because the critical regions are also affected by the exciting radiation, the normal photoelectric voltage thereby arises between the surface zones, this voltage being opposed to the injection voltage, so that the effective injection voltage is equal to that of one individual solar cell.

Separation can be achieved by several methods. These techniques will now be briefly described.

Etching of Separating-Grooves

Figure 2:
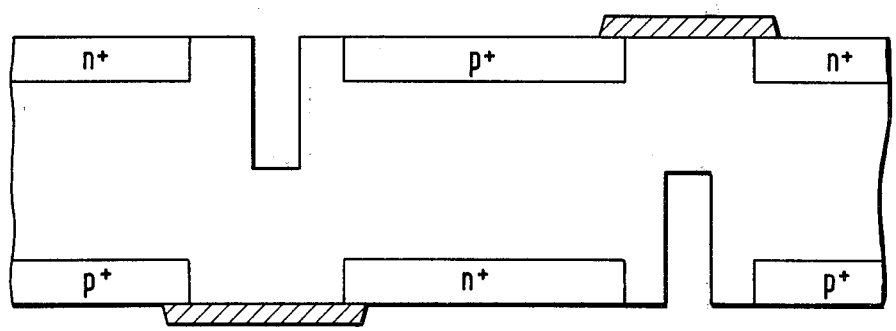
FIG. 2 shows the electric separation of the individual cells by means of etched grooves.

FIG. 2 shows how the injection currents can be eliminated by means of suitable etched grooves between the cell regions. Due to the opposing generation-voltage, previously mentioned, it is sufficient to etch the grooves through half of the substrate thickness. By doing so, the mechanical stability of the series-connected solar cell is preserved. The etching described here can be effected with the currently known methods of semiconductor technology, with the aid, for example, of etchouts acting anisotropically on crystals, or by plasma-etching. Due to the fact that the substrate is only partially etched through, the integrity of the component is preserved, whereby this solution differs from U.S. Pat. No. 3,370,986.

Doping with Recombination Centers or Traps

Figure 3:
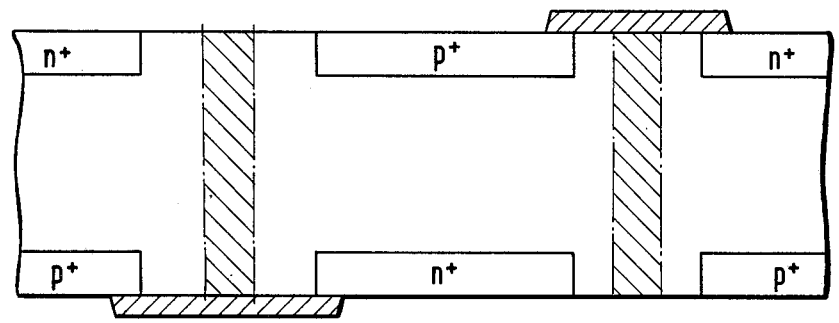
FIG. 3 shows the separation by means of doping with defect centers (hatched regions) introduced either by electron irradiation or by diffusion.

A simple, even though not completely effective separation can be achieved through doping with recombination centers or traps (FIG. 3). As is known, the current in perfect p-n transitions, when carrier injection predominates, is given by $I=I_o e^{qV/kT}$ ($I_o$=reverse (leakage) current, V=applied voltage). If space charge recombination predominates, this relationship becomes $I=I_o e^{qV/2kT}$, that is to say, the exponential factor is halved. In conjunction with the photoelectrically-generated opposing voltage, a smaller parasitic current is accordingly obtained. The defect centers, which have been introduced, are more likely to function as traps than as recombination centers. Irradiation with electron beams provides a very simple method for introducing the defect centers. The separation of circuits, which have been integrated from individual components, by means of recombination centers, is known per se from British Pat. No. 1,052,857. The process employing gold or other recombination centers, described in that publication, cannot, however, be used for the application considered here, for two reasons. 1.: Gold or other recombination centers are extraordinarily harmful for solar cells, since the diffusion lengths are reduced. It is impossible, in the light of experience, to limit the diffusion of these recombination centers to a narrow zone. In this case, the centers, which have been introduced, should therefore not function as recombination centers, but as deep traps, the latter function being brought about by markedly different capture cross sections for electrons and holes. 2.: For the reasons already mentioned in the preceding text, diffusion of the traps would necessitate an excessively large area requirement.

Protection Rings

Figure 4:
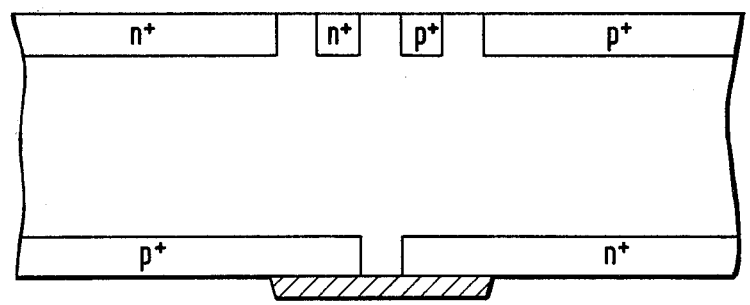
FIG. 4 shows the separation by means of unbonded $n^{30}$-junctions and p+-junctions.

A further method for attaining the object previously mentioned, comprises the arrangement of unbonded intermediate junctions (p+ or n+). By this means, the voltage is sub-divided and the injection current is also reduced (FIG. 4). Although the use of protection rings is certainly known in integrated circuit technology (see Papers of the 24th Electronic Components Conf. Wash. U.S.A., (1974) page 262, for example), protection rings are, according to that publication, used only for channel-stopping purposes. Undesired inversion layers of the n-type frequently form on p-type subtrates of high ohmic resistance, it being possible to interrupt these layers by means of p+-junctions of the type mentioned above.

Figure 5:
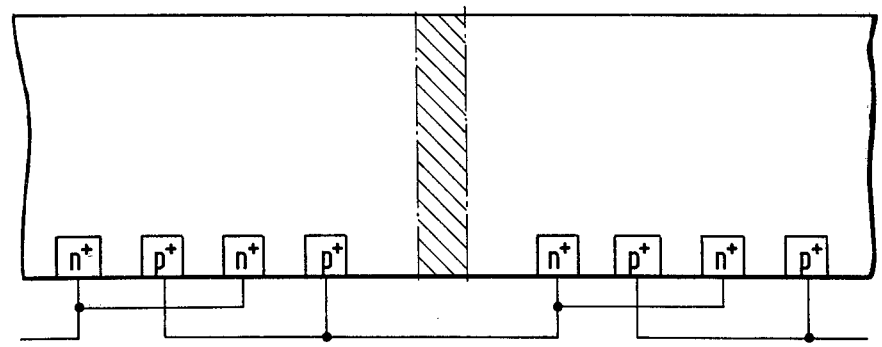
FIG. 5 shows the series-connection of an interdigitated solar cell. Within the cell units, n+-junctions and p+-junctions are interconnected, and two units are then connected so as to produce a series-connection. The electrical connections are to be understood as being a system of printed circuit tracks on the lower surface of the cell.

By means of the separation processes described, the interdigitated cell can also be used in series-connection. For this purpose, the cell must be divided into subunits, junctions possessing the same conductivity characteristics being, in each case, connected together within a unit, and these zones then being connected in turn, in series, to the other units (FIG. 5).

The integrated series-connected solar cells can be employed both as flat cells and as concentrator cells. However, the principal application is envisaged in concentrators. The series-connected cell described in the present application has the special advantage that it can be configured to be light-sensitive on both sides, since it possesses a symmetrical structure in this regard. For this reason, it can advantageously be used for concentrating systems. These systems can be of a conventional type (cf. French Published Patent Application No. 2,342,558), or they can be designed as fluorescence collectors (cf. A. Goetzberger and W. Greubel, Appl. Phys. 14, 123 (1977)).

Figure 6:
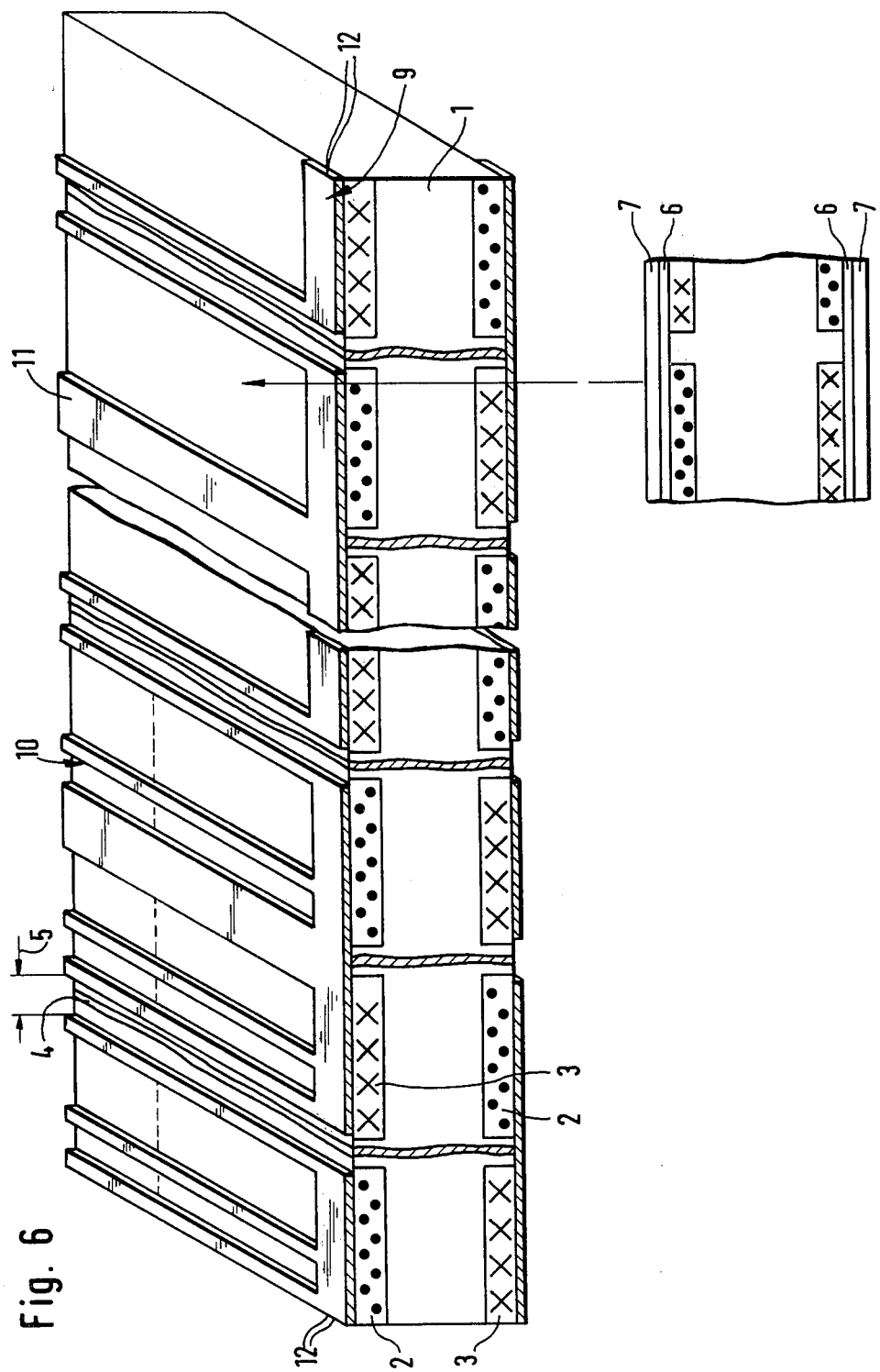
FIG. 6 shows a series-connected solar cell.

FIG. 6 shows a possible embodiment of a series-connected solar cell which can be illuminated on both sides. Starting from the basic silicon semiconductor material 1, of which the basic doping is p-type, corresponding to a specific electrical resistance of approximately 0.5 Ωcm, the doped layers—n-type 2 and p-type 3—are produced in several doping steps, or even in one step. In the next step, the carrier lifespan within the silicon, in the intermediate regions 4 between the respective individual solar cell basic elements, is so markedly reduced by electron irradiation that the diffusion length of the charge carriers, which is determined by the carrier lifespan, is small compared to the distance between two individual elements 5. The layers 6 and 7, for reducing and stabilizing the superficial recombination and, respectively, for reducing the reflectivity, are afterwards applied to the Si surface to be illuminated.

Layer 6 can be a $SiO_2$ layer, a few nanometers thick. Layer 7 can be an anti-reflection coating (multi-layered) based on indium-tin oxide or $TiO_2$, a few hundreds of nanometers thick.

The metal deposits, such as the busbar 9, the contact fingers 10 and the short-circuiting track 11, are afterwards applied, on both sides simultaneously. The short-circuiting track 11 effects an alternating series-connection of the basic solar elements. The element can be electrically connected to an external circuit at the electrical connections 12.

The invention may be embodied in other specific forms without departing from the spirit or essential characteristics thereof. The embodiments are therefore to be considered in all respects as illustrative and not restrictive.

What is claimed is:

1. An integrated solar cell array in which, in a semiconductor substrate, a number of solar cells having p-n transitions are arranged to form a series of semiconductor junctions, built up normal to the plane of the semiconductor substrate, spaced at intervals and in a row parallel to the plane of the semiconductor substrate, and in which the solar cells are series-connected by printed circuit tracks deposited on the semiconductor substrate in contact with the semiconductor junctions, characterized in that, on each of the two surfaces of a semiconductor substrate possessing a high ohmic resistance, a row of strip-shaped semiconductor junctions is arranged, these junctions having p+- and n+-conduction characteristics in alternation and being parallel to each other and spaced at intervals, in such a way that a unit solar cell comprising a semiconductor junction forming layer having a p+-conduction characteristic on one surface of the semiconductor substrate is, in each case, located opposite a semiconductor junction forming layer having an n+-conduction characteristic on the other surface, in that said printed circuit tracks are arranged, in alternation, on one surface and on the other surface of the semiconductor substrate, these tracks connecting, in each case, one solar cell unit with a neighboring unit, in series-connection, and means for electrically separating neighboring junctions which are not interconnected by said printed circuit tracks said separating means being located in the spaces between said unconnected junctions.

2. An array according to claim 1, wherein said electrical separation means comprise grooves in the substrate, the depth of these grooves amounting to at least half the thickness of the substrate.

3. An array according to claim 1, wherein said electrical separation means comprise zones of defect centers.

4. An array according to claim 1, wherein the zones of defect centers are introduced by means of electron irradiation.

5. An array according to claim 1, wherein said electrical separation means comprise narrow n+-junctions and/or p+-junctions, which are not electrically connected.

6. An array according to claim 1, wherein the solar cells are adapted to be irradiated from both sides.

7. An array according to claim 1, wherein silicon is employed as the semiconductor substrate.

8. An array according to claim 1, wherein it is used in combination with a fluorescence collector.

9. An interdigitated solar cell, consisting of a semiconductor substrate possessing a high ohmic resistance, in which a number of semiconductor junction forming layers having p+- and n+-conduction characteristics are arranged in alternation, these layers being located on the surface of the substrate facing away from the side adapted to receive incident light and being interconnected by printed circuit tracks, wherein, in said substrate several cell units, each consisting of a plurality of such semiconductor junctions forming layers having p+- and n+-conduction characteristics, are series-connected by means of printed circuit tracks, and said substrate comprises means for electrically separating adjacent cell units.

10. An interdigitated solar cell as claimed in claim 9, wherein silicon is employed as the semiconductor substrate.

11. An interdigitated solar cell as claimed in claim 9, wherein it is used in combination with a fluorescence collector.

12. An interdigitated solar cell as claimed in claim 9 wherein said means for electrically separating adjacent cell units comprise discontinuities in said substrate, the depth of said discontinuities amounting to at least half the thickness of said substrate.

13. An interdigitated solar cell as claimed in claim 9 wherein said means for electrically separating adjacent cell units comprise deep zones of defect centers located between said junctions which are not interconnected by printed circuit tracks.

14. An interdigitated solar cell as claimed in claim 13 wherein said zones of defect centers are introduced by means of electron irradiation.

15. An interdigitated solar cell as claimed in claim 9 wherein narrow n+-junctions and/or p+-junctions, which are not electrically connected, are located between the p+-junctions and n+-junctions which are not interconnected by printed circuit tracks.

* * * * *